(12) United States Patent
Shahine

(10) Patent No.: US 9,461,442 B2
(45) Date of Patent: Oct. 4, 2016

(54) LASER COMB GENERATOR

(71) Applicant: Mohamad Haidar Shahine, Ellicott City, MD (US)

(72) Inventor: Mohamad Haidar Shahine, Ellicott City, MD (US)

( * ) Notice: Subject to any disclaimer, the term of this patent is extended or adjusted under 35 U.S.C. 154(b) by 0 days.

(21) Appl. No.: 14/854,045

(22) Filed: Sep. 15, 2015

(65) Prior Publication Data

US 2016/0079735 A1   Mar. 17, 2016

Related U.S. Application Data

(60) Provisional application No. 62/051,274, filed on Sep. 16, 2014.

(51) Int. Cl.
| | |
|---|---|
| *H01S 5/10* | (2006.01) |
| *H01S 5/12* | (2006.01) |
| *H01S 5/40* | (2006.01) |
| *H01S 3/23* | (2006.01) |

(52) U.S. Cl.
CPC ............ *H01S 5/1092* (2013.01); *H01S 5/124* (2013.01); *H01S 5/4012* (2013.01); *H01S 3/2308* (2013.01)

(58) Field of Classification Search
CPC ... H01S 5/1096; H01S 5/1206; H01S 3/2308
See application file for complete search history.

(56) References Cited

U.S. PATENT DOCUMENTS

| | | | |
|---|---|---|---|
| 6,822,217 B1* | 11/2004 | Murgatroyd | G01J 3/18 250/227.14 |
| 2002/0191912 A1* | 12/2002 | Robinson | G02B 6/29394 385/37 |
| 2003/0219258 A1* | 11/2003 | Ellis | H04L 7/0075 398/155 |
| 2005/0063425 A1* | 3/2005 | Krastev | H04L 7/0075 372/6 |
| 2010/0142889 A1* | 6/2010 | Kwon | G02B 6/12004 385/24 |

* cited by examiner

*Primary Examiner* — Eric Bolda
(74) *Attorney, Agent, or Firm* — Barry Choobin; Patent 360

(57) ABSTRACT

An optical comb generator for generating multiple optical wavelengths from a single source simultaneously for many optical channels on a semiconductor substrate. The comb generator provides narrow channel spacing using chirped Bragg grating with uniformly spaced grating pitches but with tapered waveguide to facilitate the fabrication process and generate laser comb channels with uniform line widths across all channels. The laser comb generator facilitates monolithic integration of many photonic integrated circuit elements.

16 Claims, 8 Drawing Sheets

US 9,461,442 B2

LASER COMB GENERATOR

FIELD OF INVENTION

The present invention generally relates to a comb generator and more particularly to a laser comb generator for generating multiple optical wavelengths from a single source simultaneously for many optical channels on a semiconductor substrate.

BACKGROUND

Generally a frequency comb generator produces a spectrum that consists of serially spaced sharp lines with known frequencies. There are various types of comb generators such as optical frequency generator, vector signal generator, analog signal generator, function generator and arbitrary waveform generator. A comb generator is a type of signal generator which is a piece of electronic equipment that emits a regular pattern of signals. The pulse train generated by a laser has a frequency spectrum that consists of a discrete, regularly spaced series of sharp lines, known as optical frequency comb. This generator is more complex than other types of signal generators. It operates with microwave frequencies and is extremely sensitive.

In the fields of optical telecommunications, metrology and sensing applications, lasers are used to provide a source for optical signals and processing at various wavelengths. Laser processing methods allow the fabrication of very fine structures with high quality. An optical frequency comb generator, comprising a laser device (pump laser) to generate input laser light having a predetermined input light frequency. Each wavelength is generated from a single laser. Rather than using separate devices to operate at each channel, it is known to produce a single device that is capable of operating across a range of channels. If an array of lasers are used, each laser serves as a source for a single channel which becomes complex in process, and comb sources are bulky and costly and it requires rare materials for non-linear effect generation, and these combs are hard to integrate with other photonic components.

In prior art systems, a wavelength comb generator device comprises a laser source, the output of which is fed through modulators and in series to provide a wavelength comb output. To obtain this output, the modulators are in turn driven by a sinusoidal signal, providing drive signals to the modulators. One of the major limitations with the above technique is that the modulators are bulky and expensive. A number of comb-shaped sidebands are generated by optical frequency comb generator which is arranged at an equal interval on the frequency axis.

Prior art systems also include an optical frequency comb generator (OFCG) based on a fiber ring laser that provides a bandwidth of over 700 GHz with modeless operation and used to evaluate the frequency measurement of test laser. However issues associated with frequency comb generation bandwidth, pitch, spectral purity and spectral equalization are not addressed efficiently. Another major disadvantage is power dissipation and large scale component yield using array of lasers to generate an optical comb. For generating optical frequency combs, existing systems have issues in terms of complex optical setups and cost thereof.

Hence, there exists a need in the art for a method and system comprising an optical comb generator for generating multiple optical wavelengths from a single source simultaneously for multiple optical channels on a semiconductor substrate.

SUMMARY OF THE INVENTION

The objective of the invention is to provide an improved laser comb generator for generating multiple optical wavelengths from a single source simultaneously for multiple optical channels on a semiconductor substrate. In an embodiment, the present invention relates to a method for generating optical wavelengths which facilitates monolithic integration of many photonic integrated circuit elements.

Accordingly, a first embodiment of the present invention relates to a laser comb generator which uses a multi-channel laser comb device as an optical source for optical transmitter and or sensing application. The laser comb generator comprises two chirped Bragg gratings mounted at opposite ends of their tapered waveguides in order to align the reflected combs to match the cavity lengths for various comb peaks for a uniform line width channels. The chirped Bragg gratings are connected to ports of multimode interference coupler after passing optical gain chips, on each port and phase element to adjust the phase. The output of the multimode interference coupler is passed through a phase adjustment element and the output is sent into a semiconductor optical amplifier or optical gain chip to amplify the comb lines. The light output is emitted from the semiconductor optical amplifier which is used in monolithic integration of photonic integrated circuit elements.

The Laser comb generator provides narrow channel spacing using chirped Bragg grating with uniformly spaced grating pitches and a tapered waveguide in order to generate laser comb channels with uniform linewidths across all channels. A further embodiment operates a laser to provide a comb output to show a reflection response of the chirped Bragg grating using a tapered waveguide and a constant grating pitch.

According to one implementation of the present invention, a reflective semiconductor optical amplifier is used to provide pump power to the laser comb generator, using two chirped Bragg grating, with uniform grating pitch spacing and tapered waveguide. The chirped Bragg grating are mounted at opposite ends of their tapered waveguides in order to align the reflected combs to match the cavity lengths for various comb peaks for a uniform line width channels.

In another embodiment, the method of generating multiple optical wavelengths using laser comb generator may further comprise the chirped Bragg grating located at both ends of optical waveguide with reverse orientation of the tapered waveguide. Due to the placement of tapered guide the output obtained from the optical gain chip is passed through the multimode interference coupler. The output from the coupler is sent into phase element which is then transferred to semiconductor optical amplifier. The light output which is multiple wavelengths is accommodated using this implementation.

According to another embodiment of the present invention a reflective semiconductor optical amplifier is included to provide pump power to the structure of multimode interference coupler.

According to one embodiment of the present invention, introducing optical gain element which is used to provide the optical amplification and the optical splitter is added in this set up to tap the laser comb output. In this embodiment the chirped Bragg gratings are located at both the ends of the waveguide.

According to one aspect of the present invention, the chirped Bragg gratings can be located at both the ends of optical waveguide. The optical splitter taps the laser comb output. The final optical wavelength output is obtained from the optical splitter. The orientation of chirped grating is reversed to maintain same cavity lengths for all the comb modes regardless of their wavelengths.

BRIEF DESCRIPTIONS OF SEVERAL VIEWS OF DRAWINGS

DETAILED DESCRIPTION OF DIFFERENT EMBODIMENTS

The present invention is related to a laser comb generator, comprising a multi channel laser comb source which is used as an optical source for optical transmitter and sensing application. The relation between wavelength and frequency for electromagnetic waves is: $\lambda v = c$ where $\lambda$ is the wavelength, $v$ is the frequency and $c$ is the speed of light. The output from the optical pulse generator can be optical frequency comb. Sinusoidal waveform is taken for analysis in which the waveform is modulated by the optical modulation unit.

In general, optical wavelength from comb generator comprises a laser, a biasing circuit, an RF circuit, and a drive circuit to provide a drive current to the laser. In this case, the coherent comb generator is used. The above described techniques lead to complication and hence to simply the process, the present application describes about the optical comb generator to generate multiple optical wave length. The laser is maintained at a preset temperature using appropriate circuitry and devices. As known in the art, the frequency of the laser may be altered by using known techniques.

Figure 1:
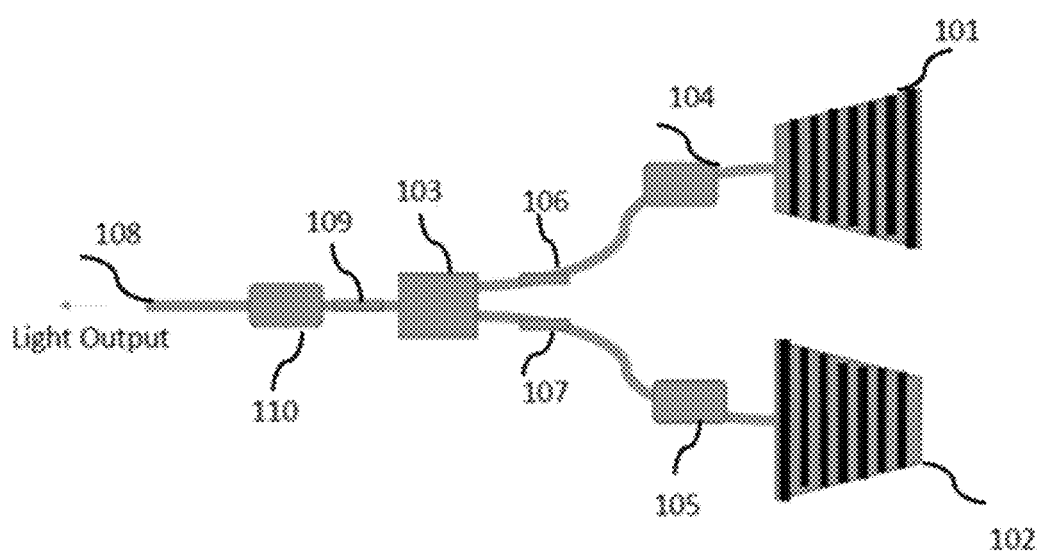
FIG. 1 shows laser comb generator with reverse orientation for one chirped Bragg grating for generation of dense optical comb.

Referring to FIG. 1, illustrating a laser comb generator device for generation of a multiple wavelength light. The laser comb generator comprises multi-channel laser comb source which is used as an optical source for optical transmitter or used for sensing application. The laser comb generator 100 is used as optical communication light source or optical sensor light source. The laser comb generator 100 comprises two chirped Bragg gratings 101, 102 with uniform grating pitch spacing and tapered waveguide. Bragg grating 101, 102 are tuned by electrical and or thermal tuning elements. The arrangement is such that the chirped Bragg grating 101, 102 are mounted at opposite ends of their tapered waveguides in order to align the reflected combs to match the cavity lengths for various comb peaks for a uniform line width channels. The output from the Chirp Bragg grating 101, 102 are connected to optical gain chip 104, 105 on each port. The laser comb generator device includes an optical gain material to provide an optical gain. Output from the optical gain chip 104, 105 are fed into a phase element 106, 107 to adjust the phase. The output from the phase element 106 & 107 is transmitted to a multimode interference coupler 103.

The multimode interference coupler 103 applications are low order couplers, splitters, combiners, switches and multiplexers. Sometimes the input and output of the optical coupler can be configured as 2×2 multimode interference couplers. The multimode interference couplers 103 include one output port and operate in the following manner. After generating output signal from the optical gain chips 104, 105 and coupling together, optical signals are sent to the multimode interference coupler 103 which transmit one of the signals as an output of the optical transmitter to a phase adjustment element 109. The signal is passed through a phase adjustment element 109 from the multimode interference coupler 103. This output is then passed into semiconductor optical amplifier or optical gain chip 110 to amplify the comb lines to generate comb lines with sufficient power for various applications. The optical amplifier 110 comprises uniform cavity length for all wavelengths. The final output 108 is obtained from the optical amplifier 110 which is a light output. This solution facilitates monolithic integration of many photonic integrated circuit elements.

Figure 2:
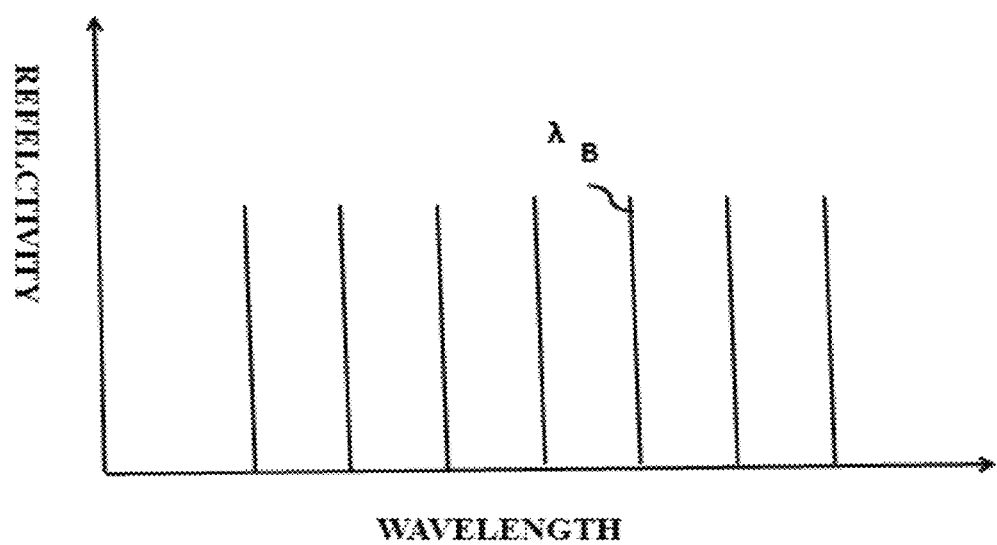
FIG. 2 shows the reflection response of the chirped Bragg grating using a tapered waveguide and a constant grating pitch.

According to an embodiment, a double chirped frequency comb is arranged so that each optical frequency emits a unique radio-frequency. The laser cavity with an effective length that has a chromatic dependence. Each reflector forming the cavity is a chirped fiber Bragg grating which emits shortest wavelengths oscillates in a relatively short cavity, and the longest wavelengths oscillate in a relatively long cavity. As shown in FIG. 2, wavelength Vs reflectivity is depicted in which the wavelength is the reflection response from the chirped Bragg grating 101 and 102. If chirped Bragg grating 101 and 102 is designed appropriately, each comb generated will be equally spaced. In this way, above described optical-comb-generator can yield equally spaced reflection response.

Figure 3:
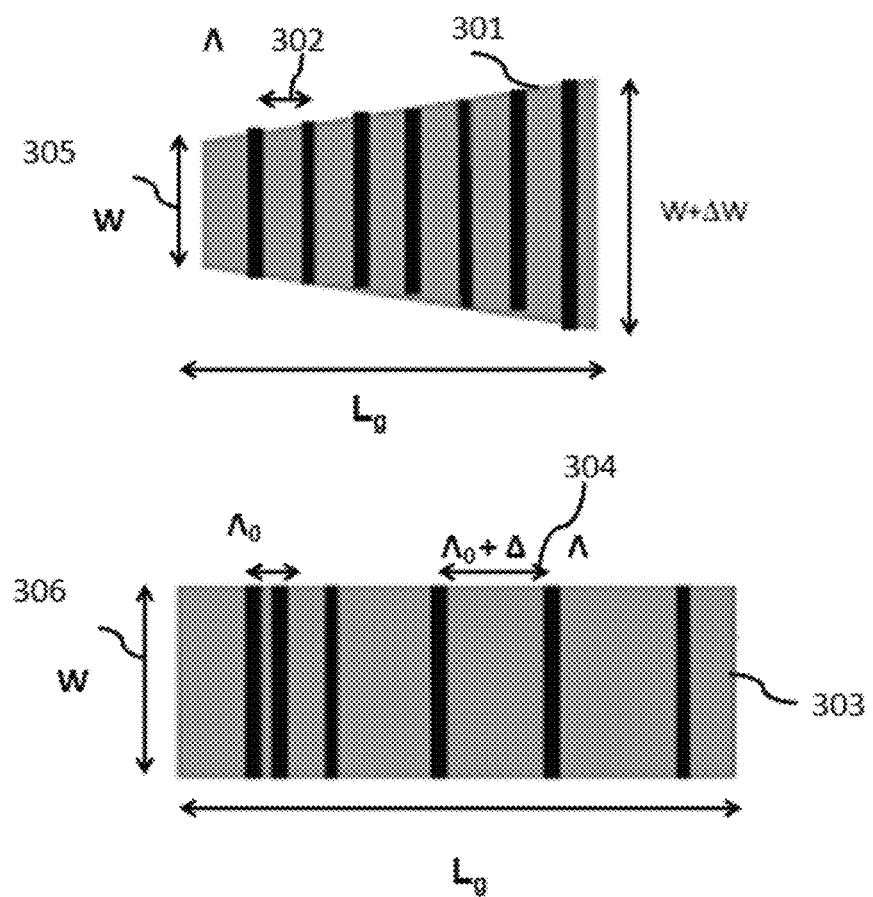
FIG. 3 shows implementation of tapered waveguide width and a constant grating pitch.

According to an embodiment, as illustrated in FIG. 3, tapered waveguide and the conventional design are elaborately discussed. The conventional design by using a constant width waveguide 303 with width 306 and using grating with tapered pitch where the pitch 304 varies in small increments. These small increments are too small for present day technology to achieve reproducible results. But fabricating Chirped Bragg grating 101 and 102 using a tapered waveguide 301 where the width 305 with constant grating pitch 302 is easy to fabricate using existing technology. During the semiconductor fabrication, optical comb generator including a light source and tapered waveguide is used. The waveguide region divides the output of the source into two (i.e) first light and second light. When the light is passed through the modulator the light is getting modulated. The waveguide, modulating region, and light source are integrated into one substrate. The tapered waveguide along with existing technology made fabrication process easy. The substrate may be formed of a single material. The light source and modulation unit may be provided on the substrate. That is, the optical comb generator including the substrate, the light source 120, and modulation unit may be integrated into a single chip.

Figure 4:
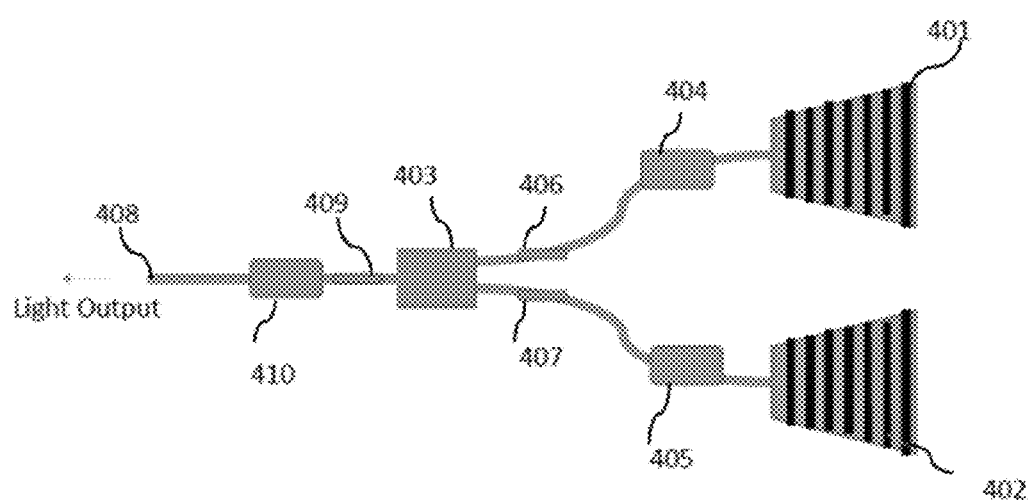
FIG. 4 shows a laser comb generator implementation with varying cavity length based on wavelength.

According to an embodiment, the present invention relates to a method for generating a multiple wavelength light using the laser comb generator which uses optical communication light source or optical sensor light source. As illustrated in FIG. 4, two chirp gratings 401 and 402 are provided with uniform grating spacing and tapered waveguide. The tapered waveguide gratings are used for obtaining constant width by grating pitch to reach high tolerance level. The output from the chirped grating mirror 401, 402 is used for implementation of laser comb generator. The chirped gratings 401, 402 with constant grating pitch are used in this implementation. The chirped gratings 401, 402 may vary cavity lengths for different wavelengths. In some embodiment the chirped gratings 401, 402 may have constant cavity length for all wavelengths. The inline chirped Bragg grating 401, 402 forms a cavity with same cavity length for all wavelengths. Output from the optical gain chip 404, 405 pass through the phase element 406, 407 to adjust the phase. The output from the phase element 406 & 407 transmitted into multimode interference coupler 403. The multimode interference coupler 403 is used to set the length at which two input light beams are output from optical gain chips 406, 407 without causing interference. The output of the Multimode Interference coupler 408 is where the laser light comb is output after going through a phase adjustment element 409. Multiple phase adjustment elements 409 can be used to control and align optical comb wavelengths. The output from the phase adjustment element 409 is passed through the semiconductor optical amplifier or optical gain chip 110 to amplify the comb lines to generate comb lines with sufficient powers for various applications.

Figure 5:
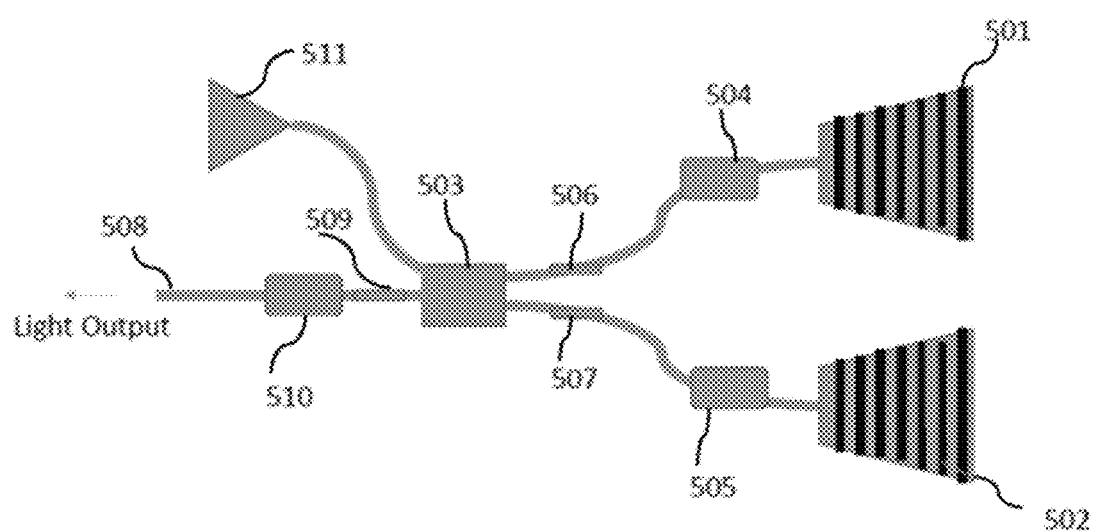
FIG. 5 shows laser comb generator assisted by a reflective semiconductor optical amplifier to provide seed light for the system.

Referring to FIG. 5 which shows a method for generating a multiple wavelength light according to another embodiment, which uses two chirped Bragg grating 501, 502 with uniform grating pitch spacing and tapered waveguide. The gratings are connected to ports 2 and 3 of Multimode Interference coupler 503 after passing optical gain chips 504, 505 on each port and phase element to adjust the phase 506, 507. The output of the multimode interference coupler 503 is passing through a phase adjustment element 509. If multiple phase adjustment 509 elements can be used to control and align optical comb wavelengths. Semiconductor optical amplifier or optical gain chip 510 receive the output from the phase adjustment element 509 which can amplify the comb lines to generate comb lines with sufficient powers. The laser light comb is the output from the optical amplifier 510. Here in this implementation it uses a reflective semiconductor optical amplifier 511 to provide pump power to this structure from port 1 of multimode interference coupler 503. The reflective semiconductor optical amplifier 511 is used for seed light introduction and it comprises uniform cavity length, such that the output is equal for all wavelengths. The optical amplifier is configured to amplify optical power of optical sidebands that are frequency offset from an input optical carrier frequency. Certain optical amplifier includes an active layer having one or more quantum well layers sandwiched between III-V separation layers, the active layer located on the substrate including an n-doped III-V material layer, and the active layer covered by a p-doped III-V cladding layer.

Figure 6:
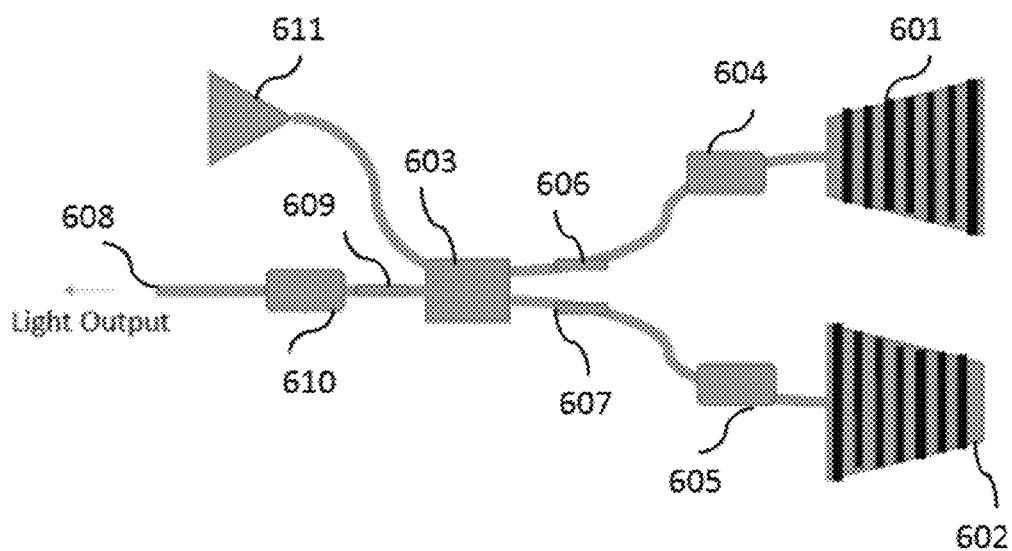
FIG. 6 shows laser comb generator assisted by a reflective semiconductor optical amplifier.

FIG. 6 illustrates a method of use of a reflective semiconductor optical amplifier 611 to provide pump power to this structure, using two chirped Bragg grating 601, 602 with uniform grating pitch spacing and tapered waveguide. The gratings are connected to ports 2 and 3 of Multimode interference coupler 603 after passing optical gain chips 604, 605 on each port and phase element to adjust the phase 606, 607. The output of the Multimode interference coupler 608 is where the laser light comb is output after going through a phase adjustment element 609 and Semiconductor optical amplifier or optical gain chip 610 to amplify the comb lines to generate comb lines with sufficient powers for various applications. This also shows an implementation of chirped Bragg grating 601 and 602 are mounted at opposite ends of their tapered waveguides in order to align the reflected combs to match the cavity lengths for various comb peaks for a uniform line width channels. The reflective semiconductor optical amplifier 611 is used for seed light introduction and it comprises uniform cavity length, such that the output is equal for all wavelengths.

Figure 7:
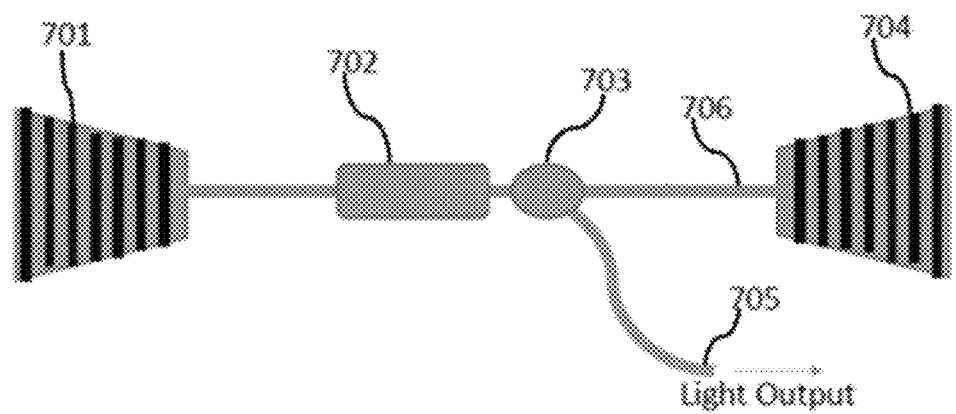
FIG. 7 shows laser comb generator using an inline cavity with tapped output through an optical splitter.

Referring to FIG. 7, which illustrates chirped Bragg gratings 701, 704 are located at both ends of optical waveguide 706, according to one embodiment. Output from the chirped Bragg grating 701, 704 is passed to optical gain element 702 to provide the optical amplification. Introducing optical splitter 703 used to tap the laser comb light output through 705. The optical splitter 703 employed in any application is used separate individual frequencies of the output from the laser to provide a plurality of outputs from the laser device. The splitter may be, for example, chirped waveguide grating, arrayed waveguide grating. The communication system may further comprise a plurality of modulators, each modulator modulating an output from the splitter to provide a modulated output. The outputs from the chirped waveguide grating or the optical splitter may be provided as inputs to other components to obtain the output. In this embodiment, laser comb generator using an inline cavity with tapped output through an optical splitter 703.

Figure 8:
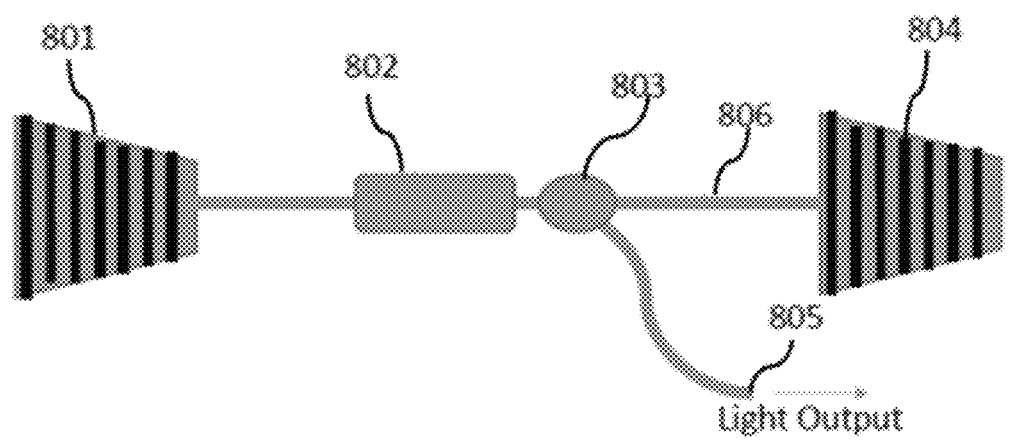
FIG. 8 shows laser comb generator using an inline cavity with tapped output.

Referring to FIG. 8, illustrating chirped Bragg gratings 801, 804 are located at both ends of optical waveguide 806, according to another embodiment. Optical gain element 802 is used to provide the optical amplification and the optical splitter 803 is used to tap the laser comb output through 805 outputs. The orientation of chirped grating 804 is reversed in this case to maintain same cavity lengths for all the comb modes regardless of their wavelengths.

The laser comb generator described above may be used generally within semiconductor fabrication or integrated chip manufacturing and also fibre communications systems. More particularly, as the comb lasers are a lower cost than previous devices, their use allows for the provision of a lower cost transmitter. The lasers may also be employed in other applications, including for example, but not limited to optical telecommunications, metrology and sensing applications, pulse generation, millimetre wave or terahertz signal generation, and micro/millimetre wave clocks. An exemplary arrangement for using a laser comb generator as provided herein in monolithic integration, as shown in FIG. 1, comprises the optical comb generator as described above. The output of the chirped grating is passed through optical gain chip and through multimode interference coupler. The output of the Multimode Interference coupler is where the laser light comb is output after going through a phase adjustment element and semiconductor optical amplifier or optical gain chip to amplify the comb lines to generate comb lines with sufficient powers for various applications.

One particular application of this invention is for use as a low cost comb generation system for facilitates monolithic integration of many photonic integrated circuit elements.

It will be appreciated that exemplary configurations of a laser comb generator device have been described to assist in an understanding of the present teaching. Modifications can be made to that described herein without departing from the scope of the present teaching as will be appreciated by those of ordinary skill. For those reasons, it will be appreciated that the scope of the present teaching should be construed as limited only in so far as is deemed necessary in the light of the appended claims which follow.

What is claimed is:

1. A laser comb generator for generating multiple optical wavelengths from a single source, the laser comb generator comprises:
   at least two chirped Bragg gratings providing narrow channel spacing with uniformly spaced grating pitches a tapered waveguide to facilitate the fabrication process and for generating laser comb channels with uniform line widths across all channels;
   a set of optical gain chips to increase the signal power transmitted from at least two chirped Bragg gratings;
   a set of phase element to change the phase of the signal transmitted from the set of optical gain chips;
   a multimode interference coupler to combine the output transmitted from the set of phase element;
   a phase adjustment element to control and align the optical comb wavelengths from the multimode interference coupler;
   an optical amplifier to amplify the optical comb wavelengths with sufficient power from the phase adjustment element;
   an optical splitter positioned to separate individual frequencies of an output from the optical amplifier to provide a plurality of output from the laser comb device to facilitate monolithic integration.

2. The laser comb generator of claim 1, wherein the generator is implemented on a semiconductor material selected from a group consisting oxides, layered semiconductors, magnetic semiconductors, organic semiconductors, charge-transfer complexes, Group I, II, III, IV, V, VI elemental and compound semiconductors.

3. The laser comb generator of claim 1, is configured to generate multiple optical wavelengths.

4. The laser comb generator of claim 1, wherein the single source comprises an optical communication light source or an optical sensor light source.

5. The laser comb generator of claim 1, wherein the at least one chirped Bragg grating is placed in reverse orientation.

6. The laser comb generator of claim 1, further comprises a reflective semiconductor optical amplifier to provide pump power from multimode interference coupler.

7. The laser comb generator of claim 6, wherein the chirped Bragg gratings are mounted at opposite ends of their tapered waveguides.

8. The laser comb generator of claim 1, wherein the chirped Bragg gratings are located at both ends of optical waveguide.

9. The laser comb generator of claim 8, wherein orientation of at least one of the chirped Bragg gratings is reversed.

10. A method of using laser comb generator for generating multiple optical wavelengths from a single source comprises:
    generating laser comb channels with uniform line widths across all channels and facilitating fabrication using at least two chirped Bragg gratings providing narrow channel spacing with uniformly spaced grating pitches a tapered waveguide;
    transmitting signal from at least two chirped Bragg gratings to a set of optical gain chips;
    transmitting signal from the set of optical gain chips to a set of phase element;
    combining the output from the set of phase element by a multimode interference coupler;
    controlling and aligning the optical comb wavelengths from the multimode interference coupler by a phase adjustment element;
    amplifying the optical comb wavelengths with sufficient power by an optical amplifier from the phase adjustment element; and
    separating individual frequencies of an output from the optical amplifier by an optical splitter positioned to provide a plurality of output from the laser comb device to facilitate monolithic integration.

11. The method according to claim 10, wherein the optical wavelength is generated by at least two chirped Bragg gratings with constant grating pitch.

12. The method according to claim 10, wherein the optical wavelength is generated by at least two chirped Bragg gratings varying cavity lengths for different wavelengths.

13. The method according to claim 10, wherein an optical wavelength is generated by at least two chirped gratings with constant cavity length for all wavelengths.

14. The method according to claim 10, wherein the two chirped Bragg gratings are mounted at opposite ends of their tapered waveguides.

15. The method according to claim 10, wherein the two chirped Bragg gratings are located at both ends of optical waveguide.

16. The method according to claim 15, wherein orientation of at least one of the chirped Bragg gratings is reversed.

* * * * *